US012677378B2

(12) United States Patent
Garing

(10) Patent No.: US 12,677,378 B2
(45) Date of Patent: *Jul. 7, 2026

(54) APPARATUS AND METHODS FOR TOOL MARK FREE STITCH BONDING

(71) Applicant: SKYWORKS SOLUTIONS, INC., Irvine, CA (US)

(72) Inventor: Aldrin Quinones Garing, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/939,420

(22) Filed: Nov. 6, 2024

(65) Prior Publication Data

US 2025/0118704 A1 Apr. 10, 2025

Related U.S. Application Data

(63) Continuation of application No. 17/557,884, filed on Dec. 21, 2021, now Pat. No. 12,142,595.

(Continued)

(51) Int. Cl.
*B23K 20/00* (2006.01)
*B23K 1/19* (2006.01)
(Continued)

(52) U.S. Cl.
CPC ................. *H05K 3/32* (2013.01); *B23K 1/19* (2013.01); *B23K 20/005* (2013.01);
(Continued)

(58) Field of Classification Search
CPC ........... H01L 24/45; H01L 2224/45144; H01L 2224/45147; H01L 2224/48091;
(Continued)

(56) References Cited

U.S. PATENT DOCUMENTS 3,404,319 A 10/1968 Tsuji et al.
5,176,310 A 1/1993 Akiyama et al.
(Continued)

FOREIGN PATENT DOCUMENTS

CN 102024724 A 4/2011
CN 109817596 A * 5/2019 ............. H01L 24/48
(Continued)

OTHER PUBLICATIONS 102021214888.3, Apparatus and Methods for Tool Mark Free Sticth Bonding, Dec. 22, 2021.

(Continued)

*Primary Examiner* — Kiley S Stoner
(74) *Attorney, Agent, or Firm* — Chang & Hale LLP

(57) ABSTRACT

Apparatus and method for tool mark free stich bonding. In some embodiments, a method for wire bonding can include feeding a wire through a capillary tip and attaching a first end of the wire to a first location, thereby forming a ball bond. The method can further include moving the capillary tip towards a second location while the wire feeds out of the capillary tip. The method can further include attaching a second end of the wire to the second location while preventing contact between the capillary tip and the second location, thereby forming a stitch bond without a tool mark at the second location.

19 Claims, 5 Drawing Sheets

Related U.S. Application Data

(60) Provisional application No. 63/130,376, filed on Dec. 23, 2020.

(51) Int. Cl.

| | |
|---|---|
| *H05K 3/32* | (2006.01) |
| *B23K 101/42* | (2006.01) |
| *H10W 72/00* | (2026.01) |
| *H10W 72/90* | (2026.01) |

(52) U.S. Cl.

CPC ........ *B23K 20/007* (2013.01); *B23K 2101/42* (2018.08); *H10W 72/01551* (2026.01); *H10W 72/07168* (2026.01); *H10W 72/07173* (2026.01); *H10W 72/075* (2026.01); *H10W 72/07521* (2026.01); *H10W 72/07533* (2026.01); *H10W 72/952* (2026.01)

(58) Field of Classification Search

CPC . H01L 2224/48227; H01L 2224/48456; H01L 2224/48465; H01L 2224/78301; H01L 2924/00014; H01L 24/43; H01L 24/05; H01L 2224/05144; H01L 2224/05155; H01L 2224/05164; H01L 2224/48106; H01L 2224/852; H01L 24/85; H01L 24/78; H01L 2224/78611; H01L 2224/78841; H01L 2224/85181; H01L 2224/85186; H01L 2224/85205; H01L 2224/85444; H01L 2224/85455; H01L 2224/85464; H01L 2224/85947; H01L 24/48; H05K 2203/049; H05K 3/32; H05K 3/328; B23K 20/233; B23K 20/26; B23K 1/19; B23K 20/005; B23K 20/007; B23K 2101/42; B23K 2103/08; B23K 2103/12; B23K 20/004

USPC ...................................... 228/4.5, 180.5, 904

See application file for complete search history.

(56) References Cited

U.S. PATENT DOCUMENTS

| | | | |
|---|---|---|---|
| 5,437,405 A | 8/1995 | Asanasavest | |
| 7,584,881 B2 * | 9/2009 | Qin | H01L 24/48 |
| | | | 257/784 |
| 8,016,182 B2 | 9/2011 | Shirato et al. | |
| 8,269,356 B2 * | 9/2012 | Pendse | H01L 23/13 |
| | | | 257/784 |
| 8,847,410 B2 * | 9/2014 | Miyoshi | H01L 23/4952 |
| | | | 257/784 |
| 2002/0023943 A1 | 2/2002 | Chapman et al. | |
| 2004/0026480 A1 | 2/2004 | Imai et al. | |
| 2005/0054186 A1 | 3/2005 | Kim et al. | |
| 2005/0109819 A1 | 5/2005 | Qin et al. | |
| 2005/0202621 A1 | 9/2005 | Wong et al. | |
| 2006/0027623 A1 | 2/2006 | Yanagisawa | |
| 2006/0032894 A1 | 2/2006 | Wong | |
| 2006/0151579 A1 | 7/2006 | Fujisawa et al. | |
| 2006/0255101 A1 | 11/2006 | Shirato et al. | |
| 2007/0125572 A1 | 6/2007 | Hsu | |
| 2008/0116548 A1 * | 5/2008 | Li | H01L 24/48 |
| | | | 257/676 |
| 2008/0164896 A1 | 7/2008 | Beaman et al. | |
| 2009/0014850 A1 | 1/2009 | Craig et al. | |
| 2009/0166774 A1 | 7/2009 | Takahira | |
| 2009/0321501 A1 * | 12/2009 | Liang | H01L 24/48 |
| | | | 228/110.1 |
| 2010/0059574 A1 | 3/2010 | Arahata et al. | |
| 2011/0057299 A1 | 3/2011 | Takata et al. | |
| 2013/0062765 A1 * | 3/2013 | Har | H01L 24/48 |
| | | | 257/E23.06 |
| 2013/0270701 A1 * | 10/2013 | Cruz | H01L 24/48 |
| | | | 257/738 |
| 2014/0070235 A1 * | 3/2014 | Andrews | H01L 24/85 |
| | | | 438/28 |
| 2014/0339290 A1 * | 11/2014 | Han | H01L 24/49 |
| | | | 228/180.5 |
| 2015/0035172 A1 * | 2/2015 | Imazeki | H01L 23/49811 |
| | | | 438/118 |
| 2015/0187729 A1 | 7/2015 | Chew | |
| 2016/0035695 A1 | 2/2016 | Kumamoto et al. | |
| 2016/0064351 A1 * | 3/2016 | Garing | H01L 24/85 |
| | | | 228/104 |
| 2016/0322329 A1 * | 11/2016 | Garing | B23K 20/233 |
| 2017/0179065 A1 | 6/2017 | Koo | |
| 2017/0179075 A1 | 6/2017 | Sato | |
| 2018/0026004 A1 | 1/2018 | Han et al. | |
| 2022/0199571 A1 * | 6/2022 | Garing | B23K 20/233 |
| 2023/0005874 A1 * | 1/2023 | Pan | H01L 23/49575 |
| 2024/0128228 A1 * | 4/2024 | Rabilas, Jr. | H01L 24/48 |
| 2024/0250060 A1 * | 7/2024 | Zhuang | H01L 24/48 |
| 2024/0250063 A1 * | 7/2024 | Xu | H01L 24/45 |

FOREIGN PATENT DOCUMENTS

| | | | | |
|---|---|---|---|---|
| JP | S62136843 A | 6/1987 | | |
| JP | S6457725 A | 3/1989 | | |
| JP | H0230153 | 1/1990 | | |
| JP | H06291160 A | 10/1994 | | |
| JP | H08130234 A | 5/1996 | | |
| JP | 2000101147 A | 4/2000 | | |
| JP | 2000114303 A | 4/2000 | | |
| JP | 2001007146 A | 1/2001 | | |
| JP | 2001068497 A | 3/2001 | | |
| JP | 2002076049 A | 3/2002 | | |
| JP | 2002171020 A | * 6/2002 | | H01L 24/48 |
| JP | 2003243436 A | 8/2003 | | |
| JP | 2003243442 A | 8/2003 | | |
| JP | 2005142314 A | 6/2005 | | |
| JP | 3753685 B2 | 3/2006 | | |
| JP | 2006196495 A | 7/2006 | | |
| JP | 2007095929 A | 4/2007 | | |
| JP | 2008135559 A | 6/2008 | | |
| JP | 2010073747 A | 4/2010 | | |
| JP | 2011060940 A | 3/2011 | | |
| JP | 2011249724 A | 12/2011 | | |
| JP | 2013175699 A | 9/2013 | | |
| JP | 2019004137 A | 1/2019 | | |
| KR | 20060117429 A | 11/2006 | | |
| KR | 10-2011-0027608 | 3/2011 | | |
| KR | 20150032900 A | * 3/2015 | | H01L 24/45 |
| KR | 20250136830 A | * 9/2025 | | H01L 24/78 |
| MY | 141420 A | 4/2010 | | |
| SG | 143060 A1 | 6/2008 | | |
| WO | 2006081056 A2 | 8/2006 | | |
| WO | 2008066190 A1 | 6/2008 | | |
| WO | 2015024597 A1 | 2/2015 | | |

OTHER PUBLICATIONS 2118666.3, Apparatus and Methods for Tool Mark Free Sticth Bonding, Dec. 21, 2021.

2305941.3, Apparatus and Methods for Tool Mark Free Stitch Bonding, Apr. 24, 2023.

2021-207058, Apparatus and Methods for Tool Mark Free Stitch Bonding, Dec. 21, 2021.

10-2021-0185998, Apparatus and Methods for Tool Mark Free Stitch Bonding, Dec. 23, 2021.

10202114325W, Apparatus and Methods for Tool Mark Free Stitch Bonding, Dec. 23, 2021.

110148389, Apparatus and Method for Tool Mark Free Stitch Bonding, Dec. 23, 2021.

* cited by examiner

APPARATUS AND METHODS FOR TOOL MARK FREE STITCH BONDING

CROSS-REFERENCE TO RELATED APPLICATION(S)

This application is a continuation of U.S. patent application Ser. No. 17/557,884, filed Dec. 21, 2021, entitled "APPARATUS AND METHODS FOR TOOL MARK FREE STITCH BONDING," which claims the benefit of U.S. Provisional Application No. 63/130,376, filed Dec. 23, 2020, entitled "APPARATUS AND METHODS FOR TOOL MARK FREE STITCH BONDING," the disclosure of each of which is hereby expressly incorporated by reference herein in its respective entirety.

BACKGROUND

Field

The present disclosure relates to wire bonding on semiconductor devices.

Description of the Related Art

Wire bonding is an electrical interconnection technique that uses thin wire and a combination of heat, pressure and/or ultrasonic energy. Wire bonding is a solid phase welding process, where two metallic materials (e.g., wire and pad surface, or wire and PCB lead surface) are brought into intimate contact. Once the materials are in intimate contact, electron sharing or inter diffusion of atoms takes place, resulting in the formation of a wire bond.

SUMMARY

In some implementations, the present disclosure relates to a method for wire bonding. The method includes feeding a wire through a capillary tip and attaching a first end of the wire to a first location, thereby forming a ball bond. The method further includes moving the capillary tip towards a second location while the wire feeds out of the capillary tip. The method further includes attaching a second end of the wire to the second location while preventing contact between the capillary tip and the second location, thereby forming a stitch bond without a tool mark at the second location.

In some embodiments, the method can further include, after forming the stitch bond, contacting the second end of the wire with the capillary tip.

In some embodiments, the method can further include, before forming the stitch bond, determining effective bonding parameters, with the bonding parameters including one or more of: impact force, bonding force, ultrasonic energy levels, pressure, and temperature.

In some embodiments, the first location can be a bond pad on a semiconductor die, and the second location can be a lead finger on a printed circuit board. The lead finger on the printed circuit board can be a thin-plated lead finger. The thin-plated lead finger can be formed of nickel, gold, and palladium.

In accordance with some implementations, the present disclosure relates to a wire bonding system that includes a handling apparatus configured to position a semiconductor die on a circuit board. The wire bonding system further includes a wire bonding apparatus configured to feed a wire through a capillary tip and attach a first end of the wire to a first location thereby forming a ball bond. The wire bonding apparatus is further configured to move the capillary tip towards a second location while the wire feeds out of the capillary tip. The wire bonding apparatus is further configured to attach a second end of the wire to the second location while preventing contact between the capillary tip and the second location, thereby forming a stitch bond without a tool mark at the second location.

In some embodiments, the wire bonding apparatus can be further configured to contact the second end of the wire with the capillary tip after forming the stitch bond.

In some embodiments, the wire bonding apparatus can be further configured to determine effective bonding parameters, with the bonding parameters including one or more of: impact force, bonding force, ultrasonic energy levels, pressure, and temperature, before forming the stitch bond.

In some embodiments, the first location can be a bond pad on a semiconductor die, and the second location can be a lead finger on a printed circuit board. The lead finger on the printed circuit board can be a thin-plated lead finger. The thin-plated lead finger can be formed of nickel, gold, and palladium.

In some teachings, the present disclosure relates to a method for wire bonding. The method includes using a capillary tool to form a ball bond on a surface of a first location and a stitch bond on a surface of a second location by feeding a wire out of a distal end of the capillary tool. The method further includes preventing contact between the distal end of the capillary tool and the surface of the second location during formation of the stitch bond.

In some embodiments, the method can further include strengthening the stitch bond by contacting the stitch bond with the distal end of the capillary tool.

In some embodiments, using the capillary tool to form the ball bond can include exposing a first end of the wire out of the distal end of the capillary tool, and attaching the first end of the wire to the surface of the first location. The first location can be a bond pad on a semiconductor die.

In some embodiments, using the capillary tool to form the stitch bond can include moving the distal end of the capillary tool towards the second location while the wire feeds out of the distal end of the capillary tool, and attaching a second end of the wire to the second location while preventing a tool mark at the second location by preventing contact between the distal end of the capillary tool and the second location. The second location can be a lead finger of a printed circuit board.

According to a number of implementations, the present disclosure relates to a wire bonding system that includes a handling apparatus configured to position a semiconductor die on a circuit board. The wire bonding system further includes a wire bonding apparatus that includes a capillary tool configured to form a ball bond on a surface of a first location and a stitch bond on a surface of a second location by feeding a wire out of a distal end of the capillary tool. The wire bonding apparatus is configured prevent contact between the distal end of the capillary tool and the surface of the second location during formation of the stitch bond.

In some embodiments, the wire bonding apparatus can be further configured to strengthen the stitch bond by contacting the stitch bond with the distal end of the capillary tool.

In some embodiments, the wire bonding apparatus can be configured to form the ball bond by exposing a first end of the wire out of the distal end of the capillary tool, and to attach the first end of the wire to the surface of the first location. The first location can be a bond pad on the semiconductor die.

In some embodiments, the wire bonding apparatus can be configured to form the stitch bond by moving the distal end of the capillary tool towards the second location while the wire feeds out of the distal end of the capillary tool, and to attach a second end of the wire to the second location while preventing a tool mark at the second location by preventing contact between the distal end of the capillary tool and the second location. The second location can be a lead finger of the printed circuit board.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are various examples of systems, apparatus, devices, structures, materials and/or methods related to wire bonding associated with a semiconductor device. Wire bonding is an electrical interconnection technique that uses thin wire and a combination of heat, pressure and/or ultrasonic energy. Wire bonding is a solid phase welding process, where two metallic materials (e.g., wire and pad surface, or wire and PCB lead surface) are brought into intimate contact. Once the materials are in intimate contact, electron sharing or inter diffusion of atoms takes place, resulting in the formation of a wire bond.

Figure 1:
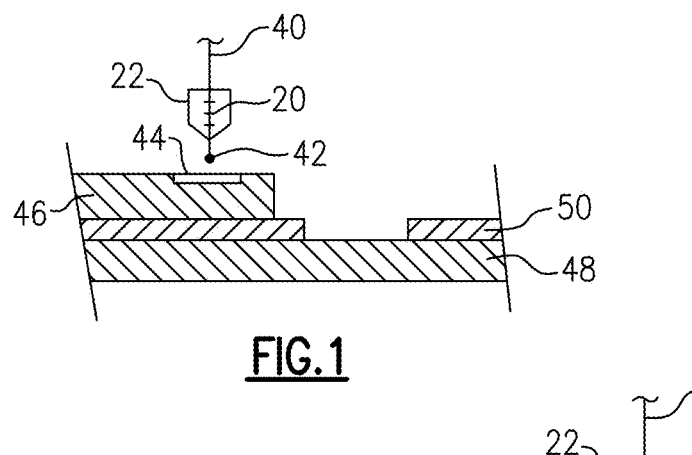
FIGS. 1, 2, 3 and 4 show steps in a wire bonding procedure.

A typical wire bonding operation is shown in FIGS. 1, 2, 3 and 4. As shown in FIG. 1, a wire 40, typically of gold or copper, is threaded through a hole 20 in a capillary tip 22. The end of the wire 40 is heated to form a ball 42 of molten metal on the end of wire 40.

Figure 2:
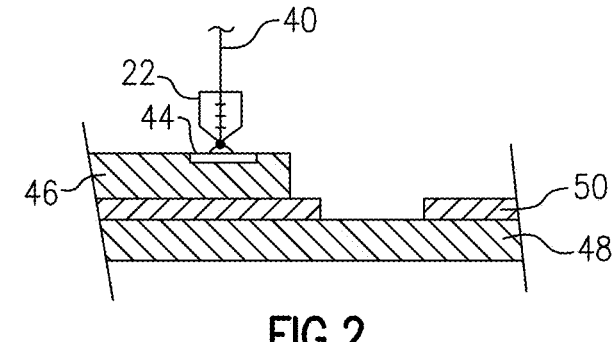

As shown in FIG. 2, capillary tip 22 is lowered toward a bond pad 44 on an active surface of a semiconductor device 46. Molten metal ball 42 is pressed by the capillary tip 22 against the bond pad 44 to alloy the metallic elements of the wire 40 and bond pad 44, thereby bonding the wire 40 to the bond pad 44 and forming a ball bond. In some instances, ultrasonic vibrations are applied to the capillary tip 22 as the molten metal ball 42 on the end of wire 40 is pressed against the bond pad 44.

Figure 3:
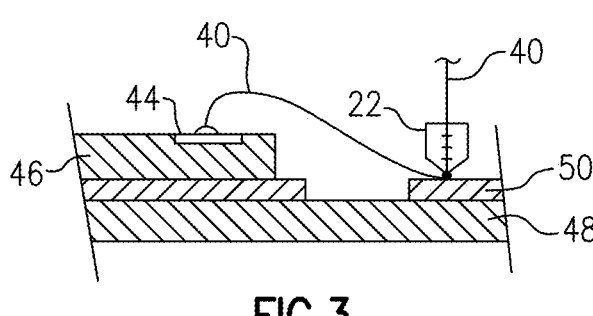

Referring to FIG. 3, capillary tip 22 is then raised, causing the wire 40 to feed through the aperture in the capillary tip 22 and move to a bonding site on a lead finger 50 of a lead frame implemented on a substrate layer 48. The wire 40 is pressed against the lead finger 50 to alloy the metallic elements of the wire 40 and the lead finger 50, thereby bonding the wire 40 to the lead finger 50 and forming a stitch bond. If desired, ultrasonic vibrations may be applied to the capillary tip 22 as the wire 40 is pressed against the lead finger 50.

Figure 4:
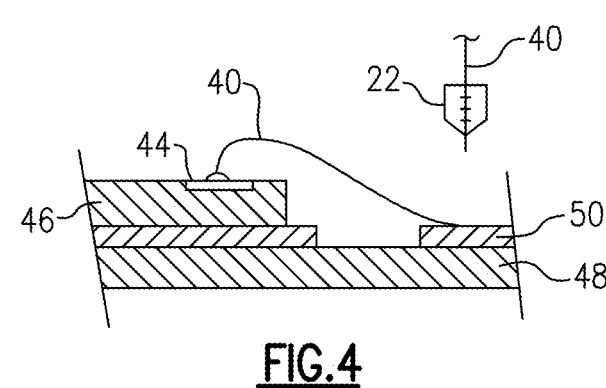

Referring to FIG. 4, capillary tip 22 is raised from the bonding site on the lead finger 50, thereby resulting in a wire bond connection between the bond pad 44 of the semiconductor device 46 and the lead finger 50 on the substrate layer 48.

Figure 5:
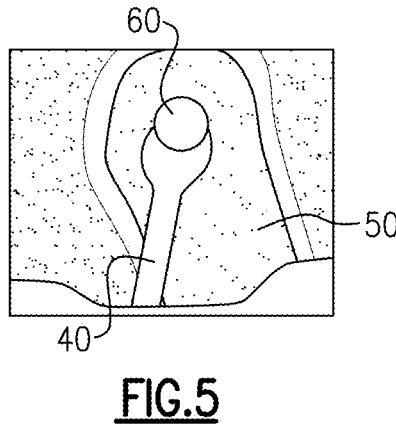
FIG. 5 shows a stitch bond and a tool mark on a lead finger.

As shown in FIG. 5, contact between the capillary tip 22 and the lead finger 50, as described above in reference to FIG. 3, creates a tool mark 60. The tool mark 60 is an imprint of the outer geometry of the capillary tip 22.

It is noted that the lead finger 50 may be a thin-plated lead finger made of very thin layers of metal (e.g., nickel, gold, and palladium) that are easily damaged. Thus, contact between the capillary tip 22 and the lead finger 50 may result in oxidation or contamination.

Figure 6:
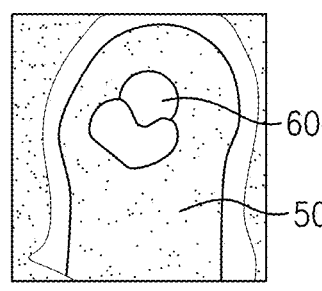
FIG. 6 shows the stitch bond of FIG. 5 after a wire pull test is performed.

As shown in FIG. 6, a wire pull test on the stitch bond results in a small amount of wire material remaining on the lead finger 50.

Figure 7:
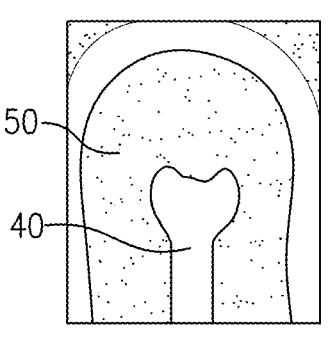
FIG. 7 shows another example of a stich bond on a lead finger.

FIG. 7 shows an example of a stitch bond formed for a wire 40 on a lead finger 50, where the stitch bond is formed without creating a tool mark. In some embodiments, such a tool mark-free stitch bond is created using a procedure (discussed in further detail below) that avoids contact between the capillary tip 22 and the lead finger 50.

A wire pull test of the tool mark-free stitch bond of FIG. 7 shows that the tool mark-free stitch bond is much stronger (e.g., requires a pull force of about 8 grams force) than a typical stitch bond (which, e.g., requires a pull force of about 6-7 grams force). The increased strength of the tool mark-free stitch bond can be seen in FIG. 8, which shows a greater amount of wire material remaining on the lead after a pull test.

Figure 8:
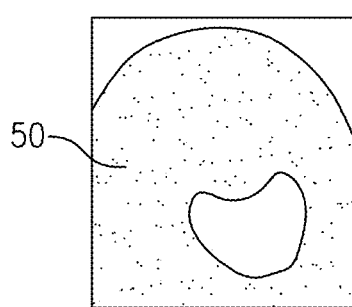
FIG. 8 shows the stitch bond of FIG. 7 after a wire pull test is performed.

A comparison between FIG. 8 and FIG. 6 shows that the tool mark-free stitch bond has increased strength and reliability compared to the typical stitch bond formed by contacting the lead finger 50 with the capillary tip 22. For example, in FIG. 6, a portion of the stitch bond itself fails during the pull test, whereas in FIG. 6, a portion of the wire 40 itself fails during the pull test while the tool mark-free stitch bond remains intact with respect to the lead finger 50.

Figure 9B:
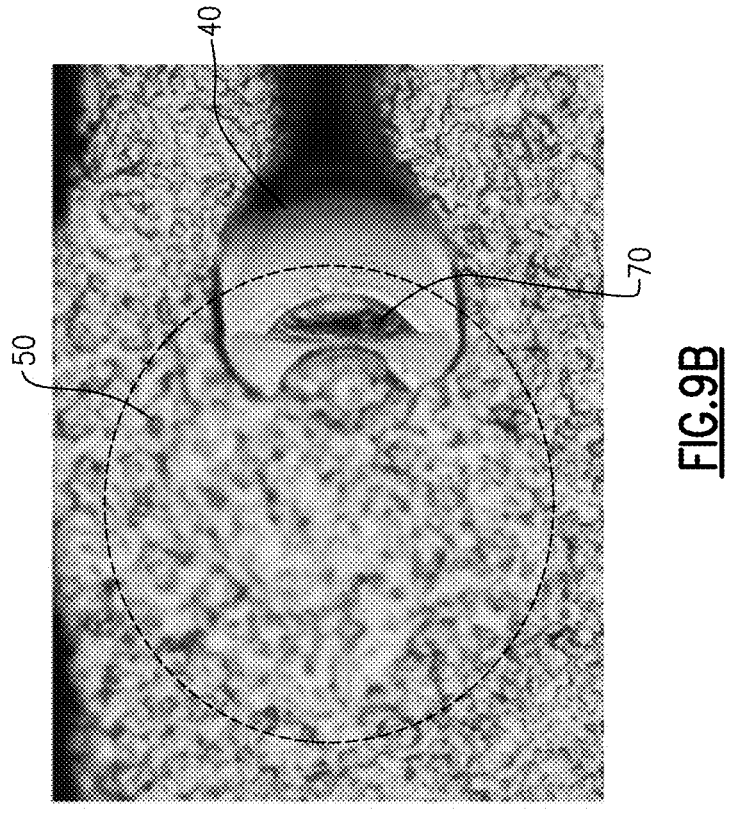
FIG. 9B shows the stitch bond of FIG. 9A after the stitch bond is impacted with a capillary tip.
Figure 9A:
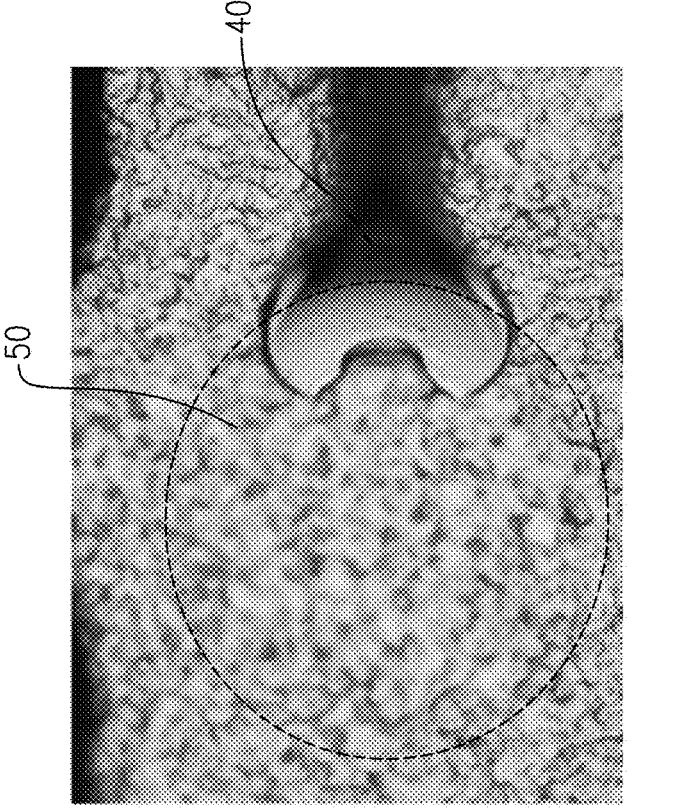
FIG. 9A shows a stitch bond.

In some embodiments, the strength of a tool mark-free stitch bond as described herein may be increased by contacting the stitch bond with the capillary tip 22 after the stitch bond has been formed. For example, FIG. 9A depicts the tool mark-free stitch bond, and FIG. 9B depicts the tool mark-free stitch bond after it has been impacted with the capillary tip. As shown in FIG. 9B, this double impact creates a cup or dimple 70 on the stitch bond, thereby forming a more secure stitch bond.

In some embodiments, a stitch bond may be formed without creating a tool mark by optimizing or selecting one or more bonding parameters in order to minimize or reduce contact between the capillary tip 22 and the lead finger 50.

Such bonding parameters may include impact force, bonding force, ultrasonic energy levels, pressure, and temperature.

Figure 10:
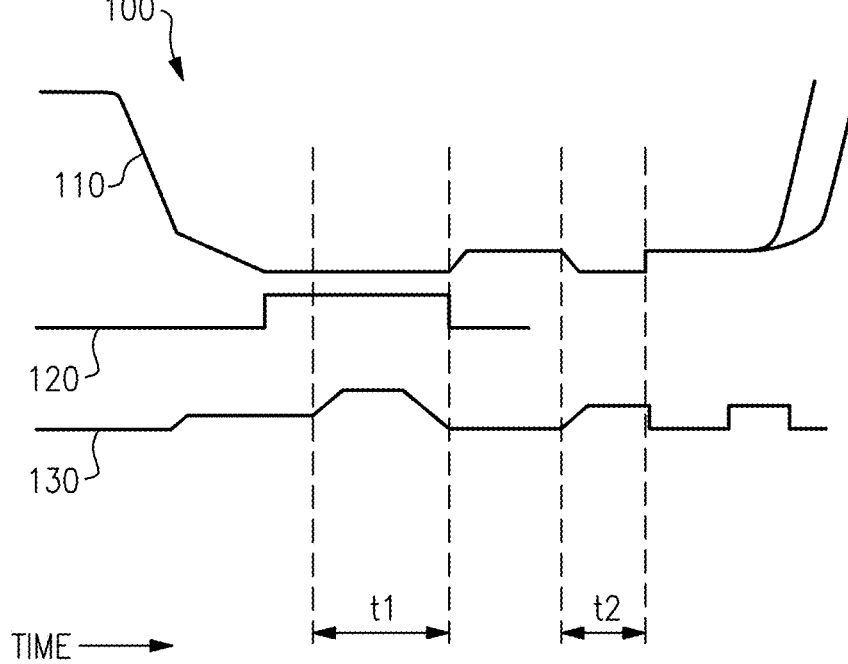
FIG. 10 shows an example of a timing chart of bonding parameters during a stitch bond procedure.

For example, FIG. 10 depicts a timing graph 100 of a method used for creating a tool mark-free stitch bond. During time period t1, a tool mark-free stitch bond is formed. During time period t2, an optional security stitch bond can be formed.

In the example of FIG. 10, the first line 110 depicts the movement of the capillary tip with respect to the semiconductor device. During the bond time period t1, the position of the capillary tip is closest to the lead finger without making contact. During the security bond time period t2, the position of the capillary tip is again closest to the lead finger.

The second line 120 represents the bond force between the capillary tip and the lead finger. The bond force is highest during the bond time period t1.

The third line 130 represents the ultrasonic energy level. The ultrasonic energy level is highest during some or all of the bond time period t1 and some or all of the security stitch bond time period t2.

Figure 11:
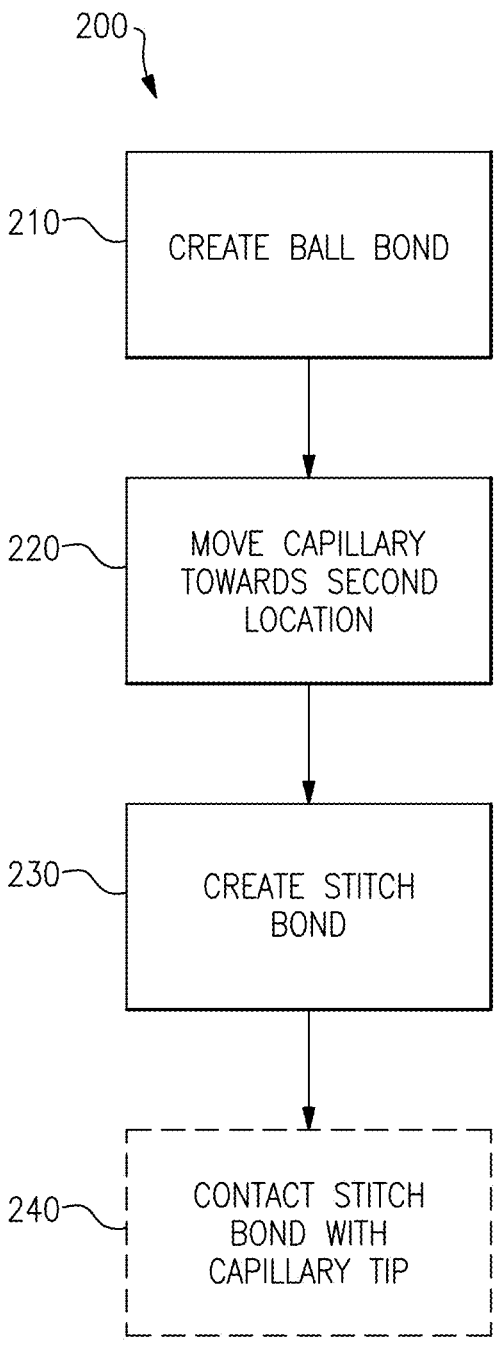
FIG. 11 shows an example of a flow chart of a method for attaching a wire in a semiconductor device.

FIG. 11 depicts steps in a process 200 that can be implemented to achieve wire bonds having one or more features as described herein. As described herein, the process 200 can provide bonding of a wire to a semiconductor device without creating a tool mark.

In some embodiments, the process 200 can include or be provided with a wire being fed through a capillary tip, such as the example shown in FIG. 1. In step 210, a ball bond is created by attaching a first end of the wire to a first location on a substrate. The substrate may be a packaging substrate, a semiconductor substrate (such as a bond pad 44 on a semiconductor die 46, as shown in FIGS. 1 and 2), or the like.

In step 220, the capillary tip is moved towards a second location while the wire feeds out of the capillary tip. The second location may be a packaging substrate (such as a PCB lead finger 50, as shown in FIGS. 3 and 4), a semiconductor substrate, or the like.

In step 230, the second end of the wire is bonded to the second location while preventing contact between the capillary tip and the second location. In this manner, a stitch bond is created and a tool mark is prevented at the stitch bond location.

In an optional step 240, the capillary tip contacts the second end of the wire after the stitch bond is formed in order to increase the strength of the stitch bond.

In some embodiments, effective bonding parameters can be determined in order to form a stitch bond as described herein while preventing a tool mark at the stitch bond site. In some embodiments, such bonding parameters can be determined prior to step 210.

In some embodiments, some or all of the wire bonding operations as described herein can be controlled by one or more computers. Such computers can obtain the foregoing bonding parameters, and apply such parameters during control of the wire boding operations.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for wire bonding, the method comprising:
   feeding a wire through a capillary tip;
   attaching a first end of the wire to a first location, thereby forming a ball bond;
   moving the capillary tip towards a second location while the wire feeds out of the capillary tip;
   attaching a second end of the wire to the second location while preventing contact between the capillary tip and the second location, thereby forming a stitch bond without a tool mark created by the capillary tip at the second location; and
   after forming the stitch bond, moving the capillary tip farther from the second location in an opposite direction from the first location and contacting the second end of the wire with the capillary tip to form a security stitch bond at a location that is farther from the second location in the opposite direction from the first location, the stitch bond and the security stitch bond forming respective crescent shapes facing the same direction, a semicircular recessed area existing between the stitch bond and the security stitch bond.

2. The method of claim 1 further comprising, before forming the stitch bond, determining effective bonding parameters, the bonding parameters including one or more of: impact force, bonding force, ultrasonic energy levels, pressure, or temperature.

3. The method of claim 1 wherein the first location is a bond pad on a semiconductor die, and the second location is a lead finger on a printed circuit board.

4. The method of claim 3 wherein the lead finger on the printed circuit board is a thin-plated lead finger.

5. The method of claim 4 wherein the thin-plated lead finger is formed of nickel, gold, and palladium.

6. A wire bonding system comprising:
   a handling apparatus configured to position a semiconductor die on a circuit board; and
   a wire bonding apparatus configured to feed a wire through a capillary tip and attach a first end of the wire to a first location thereby forming a ball bond, the wire bonding apparatus further configured to move the capillary tip towards a second location while the wire feeds out of the capillary tip, the wire bonding apparatus further configured to attach a second end of the wire to the second location while preventing contact between the capillary tip and the second location, thereby forming a stitch bond without a tool mark created by the capillary tip at the second location, the wire bonding apparatus further configured to, after forming the stitch bond, move the capillary tip farther from the second location in an opposite direction from the first location and contact the second end of the wire with the capillary tip to form a security stitch bond at a location that is farther from the second location in the opposite direction from the first location, the stitch bond and the security stitch bond forming respective crescent shapes facing the same direction, a semicircular recessed area existing between the stitch bond and the security stitch bond.

7. The system of claim 6 wherein the wire bonding apparatus is further configured to determine effective bonding parameters, the bonding parameters including one or more of: impact force, bonding force, ultrasonic energy levels, pressure, or temperature, before forming the stitch bond.

8. The system of claim 6 wherein the first location is a bond pad on a semiconductor die, and the second location is a lead finger on a printed circuit board.

9. The system of claim 8 wherein the lead finger on the printed circuit board is a thin-plated lead finger.

10. The system of claim 9 wherein the thin-plated lead finger is formed of nickel, gold, and palladium.

11. A method for wire bonding, the method comprising:

using a capillary tool to form a ball bond on a surface of a first location and a stitch bond on a surface of a second location by feeding a wire out of a distal end of the capillary tool;

preventing contact between the distal end of the capillary tool and the surface of the second location during formation of the stitch bond; and after forming the stitch bond, moving the distal end of the capillary tool farther from the second location in an opposite direction from the first location and contacting the stitch bond with the distal end of the capillary tool to form a security stitch bond at a location that is farther from the second location in the opposite direction from the first location, the stitch bond and the security stitch bond forming respective crescent shapes facing the same direction, a semicircular recessed area existing between the stitch bond and the security stitch bond.

12. The method of claim 11 wherein the contacting the stitch bond with the distal end of the capillary tool strengthens the stitch bond.

13. The method of claim 11 wherein the using the capillary tool to form the ball bond includes exposing a first end of the wire out of the distal end of the capillary tool, and attaching the first end of the wire to the surface of the first location.

14. The method of claim 13 wherein the first location is a bond pad on a semiconductor die.

15. The method of claim 11 wherein the using the capillary tool to form the stitch bond includes moving the distal end of the capillary tool towards the second location while the wire feeds out of the distal end of the capillary tool, and attaching a second end of the wire to the second location while preventing a tool mark created by the distal end of the capillary tool at the second location by preventing contact between the distal end of the capillary tool and the second location.

16. The method of claim 15 wherein the second location is a lead finger of a printed circuit board.

17. The method of claim 16 wherein the lead finger on the printed circuit board is a thin-plated lead finger.

18. The method of claim 17 wherein the thin-plated lead finger is formed of nickel, gold, and palladium.

19. The method of claim 11 further comprising, before forming the stitch bond, determining effective bonding parameters, the bonding parameters including one or more of: impact force, bonding force, ultrasonic energy levels, pressure, or temperature.

\* \* \* \* \*